(12) United States Patent
Deligianni et al.

(10) Patent No.: US 7,539,051 B2
(45) Date of Patent: May 26, 2009

(54) MEMORY STORAGE DEVICES COMPRISING DIFFERENT FERROMAGNETIC MATERIAL LAYERS, AND METHODS OF MAKING AND USING THE SAME

(75) Inventors: Hariklia Deligianni, Tenafly, NJ (US); Qiang Huang, Ossining, NY (US); Lubomyr T. Romankiw, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 11/620,445

(22) Filed: Jan. 5, 2007

(65) Prior Publication Data
US 2008/0165576 A1 Jul. 10, 2008

(51) Int. Cl.
*G11C 11/15* (2006.01)
(52) U.S. Cl. .................... 365/173; 257/421; 438/3; 977/933
(58) Field of Classification Search ............ 365/171, 365/173, 158; 257/421, E21.665; 438/3; 977/934, 935
See application file for complete search history.

(56) References Cited
U.S. PATENT DOCUMENTS

| | | | |
|---|---|---|---|
| 3,806,899 A | 4/1974 | Meyer et al. | |
| 3,825,910 A | 7/1974 | Carr, Jr. et al. | |
| 6,834,005 B1 | 12/2004 | Parkin | |
| 6,898,132 B2 | 5/2005 | Parkin | |
| 2004/0251232 A1* | 12/2004 | Chen et al. ............ | 216/22 |
| 2005/0180202 A1 | 8/2005 | Huai | |
| 2006/0120132 A1 | 6/2006 | Parkin | |

OTHER PUBLICATIONS

Parkin, S. S. P. et al., Oscillations in Exchange Coupling and Magnetoresistance in Metallic Superlattice Structures: Co/Ru, Co/Cr, and Fe/Cr, The American Physical Society, 1990, pp. 2304-2308, vol. 64, No. 19.
Parkin S. S. P., Oscillations in Giant Magnetoresistance and Antiferromagnetic Coupling in [Ni81Fe19/Cu]N Multilaters, Appl. Phys. Lett., Jan. 27, 1992, pp. 512-514, vol. 60, No. 4.

(Continued)

*Primary Examiner*—Richard Elms
*Assistant Examiner*—Harry W Byrne
(74) *Attorney, Agent, or Firm*—Scully, Scott, Murphy & Presser, P.C.; Ido Tuchman, Esq.

(57) ABSTRACT

A memory storage device that contains alternating first and second ferromagnetic material layers is provided. Each first ferromagnetic material layer has a first layer thickness ($L_1$) and a first critical current density ($JC_1$), and each second ferromagnetic material layer has a second layer thickness ($L_2$) and a second critical current density ($JC_2$), provided that $JC_1 < JC_2$, $L_1$ is greater than about 300 nm, and $L_2$ ranges from about 20 nm to about 200 nm. The device further comprises alternating magnetic domains of opposite directions that are separated by domain walls. The magnetic domains and domain walls are movable across the first and second ferromagnetic material layers upon application of a driving current. Correspondingly, data can be stored in the memory storage device as locations of the magnetic domains and domain walls.

22 Claims, 8 Drawing Sheets

OTHER PUBLICATIONS

Jimbo, Mutsuko, Giant Magnetoresistance in FeNiCO / Cu Multilayers, Jpn. J. Appl. Phys., Sep. 15, 1992, pp. L 1348-L 1350, vol. 31, Part 2, No. 9B.

Alper, M. et al., Giant Magnetoresistance in Electrodeposited Superlattices, Appl. Phys. Lett, Oct. 11, 1993, pp. 2144-2146, vol. 63, No. 15.

Ross, C. A., Electrodeposited Multilayer Thin Films, Annu. Rev. Mater. Sci., 1994, pp. 159-188, vol. 24, downloaded from arjournals.annualreviews.org.

Martin, Charles R., Nanomaterials: A Membrane-Based Synthetic Approach, Science, New Series, Dec. 23, 1994, pp. 1961-1966, vol. 266, No. 5193, downloaded from www.jstor.org.

Tatara, Gen et al., Theory of Current-Driven Domain Wall Motion: Spin Transfer versus Momentum Transfer, Physical Review Letters, Feb. 27, 2004, pp. 086601-1-086601-4, vol. 92, No. 8.

Thiaville, A. et al, Micromagnetic Understanding of Current-Driven Domain Wall Motion in Patterned Nanowires, Europhysics Letters, Mar. 15, 2005, pp. 990-996, vol. 69, No. 6.

* cited by examiner

US 7,539,051 B2

MEMORY STORAGE DEVICES COMPRISING DIFFERENT FERROMAGNETIC MATERIAL LAYERS, AND METHODS OF MAKING AND USING THE SAME

CROSS-REFERENCE TO RELATED APPLICATION

The present application is related to co-pending U.S. patent applications entitled "FORMATION OF NANOSTRUCTURES COMPRISING COMPOSITIONALLY MODULATED FERROMAGNETIC LAYERS BY PULSED ECD" (PGPub. 2008/0166584 A1) and "FORMATION OF VERTICAL DEVICES BY ELECTROPLATING" (PGPub. 2008/0166874 A1), which were filed on even date herewith and are assigned to the same assignee as the present application. The entire contents of such co-pending U.S. patent applications are incorporated herewith by reference for all purposes.

FIELD OF THE INVENTION

The present invention generally relates to magnetic memory storage devices. Specifically, the present invention relates to magnetic memory storage devices that comprise alternating layers of different ferromagnetic materials. Data can be stored in such magnetic memory storage devices as locations of magnetic domains and domain walls, and an electric current can be used to move such magnetic domains and domain walls past a reading or writing device for reading data from, or writing data into, such memory storage devices.

BACKGROUND OF THE INVENTION

A magnetoresistive random access memory (MRAM) device uses the directions of magnetic moments in a ferromagnetic material to store data. The term "ferromagnetic material" as used herein refers to any material that exhibits spontaneous magnetization.

Typically, in an equilibriated or non-magnetized ferromagnetic material, the magnetic moments of atoms within a relatively large volume of such a ferromagnetic material are aligned parallelly to one another (i.e., they have the same direction) due to magnetic exchange interactions between the atoms, thereby forming magnetic domains. Although the magnetic moments of atoms within the same magnetic domains are aligned in a parallel manner, adjacent magnetic domains can be randomly oriented, i.e., the magnetic moments of atoms in adjacent magnetic domains have different directions. The boundary between two adjacent magnetic domains is typically referred to as a domain wall. In a domain wall region, the direction of magnetization gradually changes on the atomic scale. However, when a sufficiently strong external magnetic field is applied to the ferromagnetic material, all the magnetic domains in the ferromagnetic material align along the direction of the applied magnetic field (i.e., the direction of magnetization). When the external magnetic field is removed, the magnetic domains in the ferromagnetic material still remain oriented in the direction of magnetization. Application of another enough-strong magnetic field in a new direction will cause the magnetic domains to realign to the direction of the new magnetic field.

One approach to MRAM uses a magnetic tunneling junction as a memory cell The magnetic tunneling junction is formed by separating two layers of a ferromagnetic material by a thin layer of an insulating material. Each ferromagnetic material layer comprises a single magnetic domain. The magnetic domain in the first ferromagnetic material layer has a fixed direction, while the magnetic domain direction in the second ferromagnetic material layer is allowed to shift in response to an external magnetic field. Consequently, the domain direction of the second ferromagnetic material layer is either parallel or opposite to that of the first ferromagnetic material layer, which denotes a "0" or "1" state for the purpose of memory storage.

However, currently available MRAM devices can only store up to 1 megabit (Mb), which is much less than what is needed in most memory applications. In addition, each MRAM memory cell stores only one bit of data at a time, thereby significantly limiting the maximum possible memory capacity of such devices.

Therefore, there is a continuing need for improved MRAM devices with high storage density and large storage capacity.

U.S. Pat. No. 6,834,005 issued on Dec. 21, 2004 for "SHIFTABLE MAGNETIC SHIFT REGISTER AND METHOD OF USING THE SAME," which is owned by the same entity as the present invention, discloses a memory storage device that contains a data storage track formed of a ferromagnetic wire or a strip of a ferromagnetic material.

FIG. 1A shows a partial view of such a ferromagnetic wire 100, which is homogeneously magnetized with only one magnetic domain. The arrowheads in FIG. 1A represent the magnetic moments of atoms in the ferromagnetic wire 100, which are uniformly oriented toward the right. The ferromagnetic wire 100 can be magnetized in small sections to form magnetic domains 102 and 106 of opposite directions, as shown in FIG. 1B. Such opposite magnetic domains 102 and 106 are separated from each other by a domain wall 104, within which the magnetization gradually changes from one direction to another, as shown by the arrowheads in FIG. 1B. When a current of electrons is applied to the ferromagnetic wires from right to left, as indicated by the dotted arrowheads in FIG. 1C, the magnetic domain 102 on the right expands, because the electrons are polarized by the magnetization in the domain 102. The polarized electrons have the same spin as the atoms or ions in the domain 102 and exert a force on the domain wall 104. When the density of the driving current is sufficient to overcome the resistance of the ferromagnetic material, the domain wall 104 moves from right to left.

The typical relationship between the domain wall velocity (V) and the density of the driving current is illustrated in the plot shown by FIG. 2. When the density of the driving current is below a critical current density (JC), the domain wall velocity (V) will be zero, i.e., no movement of the domain walls will be observed. When the driving current is equal to or greater than the critical current density (JC), the domain walls will move at a velocity that correlates with the specific density of the driving current.

The above-described ferromagnetic wire can therefore function as a data storage track, where information can be stored therein as the magnetic domains. An electric current can be used to effectuate the movement of such magnetic domains and the associated domain walls along the data storage track in the direction of the electron flow. When the magnetic domains and domain walls are moved past a reading device, information can be read from the data storage track. Similarly, when the magnetic domains and domain walls are moved past a writing device, information can be written into the storage track.

The memory storage device disclosed by U.S. Pat. No. 6,834,005 can be used to store numerous bits of data (i.e., on the order of 100 bits or more). Consequently, a small number of magnetic elements can be used to store a very large amount of data, which have important applications in various electronic devices, such as digital cameras, personal digital assistants, security devices, memory sticks, removable storage devices, etc.

There is a continuing need to improve the memory storage device disclosed by U.S. Pat. No. 6,834,005. More specifically, there is a need for precisely controlling movements of the magnetic domains and domain walls along the data storage track and avoiding deleterious drifting of the magnetic domains or domain walls, so that more accurate and reliable data reading and writing can be achieved. In addition, it would be desirable to provide a device that can be fabricated at lower cost with higher precision.

SUMMARY OF THE INVENTION

The present invention employs ferromagnetic structures that comprise alternating ferromagnetic layers of different critical current densities and different layer thicknesses for precise control of the magnetic domain and domain wall movements along the ferromagnetic structures.

In one aspect, the present invention relates to a structure comprising at least a plurality of alternating first and second ferromagnetic layers, wherein each of the first ferromagnetic layers has a first layer thickness ($L_1$) and a first critical current density ($JC_1$), and wherein each of the second ferromagnetic layers has a second layer thickness ($L_2$) and a second critical current density ($JC_2$), wherein $JC_1 < JC_2$, wherein $L_1$ is greater than about 300 nm, and wherein $L_2$ ranges from about 20 nm to about 200 nm. More preferably, $L_1$ is greater than about 400 nm, and $L_2$ ranges from about 40 nm to about 200 nm.

In a preferred embodiment of the present invention, the structure as described hereinabove further comprises a plurality of alternating magnetic domains of opposite magnetization that are separated from each other by domain walls located therebetween. The magnetic domains and domain walls can be moved across the first and second ferromagnetic layers upon application of a driving current to the structure.

The structure as described hereinabove may comprise one or more additional layers between the first and second ferromagnetic layers. Such additional layers may be extremely thin, e.g., less than 10 nm. The additional layers can be either ferromagnetic or non-ferromagnetic, and they may be provided to achieve various different functions, such as separating or isolating the first and second ferromagnetic layers, etc.

The first and second ferromagnetic layers as described hereinabove may differ in one or more properties selected from the group consisting of material composition, stress, local roughness, grain size, spin polarization, saturation magnetization, spin transfer efficiency, local spin, lattice constant, coercivity, magnetic anisotropy, exchange coupling energy, domain wall thickness, and magnetostriction.

In a preferred, but not necessary, embodiment of the present application, the first and second ferromagnetic layers differ in their material compositions. For example, the first and second ferromagnetic material layers may comprise different ferromagnetic elements. Alternatively, the first and second ferromagnetic layers may comprise the same ferromagnetic elements mixed or alloyed with different non-ferromagnetic elements. Further, the first and second ferromagnetic layers may comprise the same ferromagnetic elements hut in different proportions. Still further, the first and second ferromagnetic layers may comprise the same elements and same compositions, but with different grain structures or grain sizes.

For example, both the first and second ferromagnetic layers comprise Ni—Fe alloys but with different weight proportions of Ni and Fe. The first ferromagnetic material layers may comprise a first Ni—Fe alloy having from about 75 wt % to about 85 wt % of Ni and from about 15 wt % to about 25 wt % of Fe, and the second ferromagnetic material layers may comprise a second Ni—Fe alloy having from about 30 wt % to about 60 wt % of Ni and from about 40 wt % to about 70 wt % of Fe.

The first and second ferromagnetic material layers are preferably formed as a metal wire that has a diameter ranging from about 20 nm to about 500 nm, more preferably from about 20 nm to about 200 nm.

In another aspect, the present invention relates to a memory device comprising:

a memory storage element comprising the structure as described hereinabove, wherein data is stored in the memory storage element as locations of magnetic domains and domain walls;

a reading element positioned in proximity to the memory storage element for selectively reading data from the memory storage element; and a writing element positioned in proximity to the memory storage element for selectively writing data into the memory storage element.

Preferably, the memory storage element further comprises a current source for applying a driving current to the memory storage element to effectuate movements of the domain walls across the first and second ferromagnetic layers. The driving current is preferably, but not necessarily, a pulsed current with alternating high and low current pulses. The low current pulses preferably have a relatively low current density ($J_{low}$) that is greater than $JC_1$ but less than $JC_2$ for moving the domain walls across the first ferromagnetic layers and stopping at the second ferromagnetic layers. The high current pulses preferably have a relatively high current density ($J_{high}$) that is greater than $JC_2$ for moving the domain walls out of the second ferromagnetic layers.

The duration of the high and low current pulse is well controlled to ensure that the domain walls are precisely pinned at the second ferromagnetic layers. More specifically, when the domain walls have a first velocity ($V_1$) in the first ferromagnetic layers under the low current pulses, a second velocity ($V_1'$) in the first ferromagnetic layers under the high current pulses, and a third velocity ($V_2$) in the second ferromagnetic layers under the high current pulses, the duration of the low current pulses ($D_{low}$) is preferably equal to or greater than $L_1/V_1$ but less than $2 \times L_1/V_1$, and the duration of the high current pulses ($D_{high}$) is equal to or greater than $L_2/V_2$ but less than $L_2/V_2 + L_1/V_1'$.

The reading and writing elements as described hereinabove preferably read from and write to the memory storage element at the end of a low current pulse but before next high current pulse is applied.

In a still farther aspect, the present invention relates to a method comprising:

forming a memory storage element comprising the structure as described hereinabove, wherein data is stored in the memory storage element as specific locations of magnetic domains and domain walls;

selectively reading data from the memory storage element; and selectively writing data into the memory storage element.

In yet another aspect, the present invention relates to a method comprising:

forming a memory storage element comprising at least a plurality of alternating first and second ferromagnetic layers, wherein each of the first ferromagnetic layers has a first critical current density ($JC_1$), wherein each of the second ferromagnetic layers has a second critical current density (JC$_2$), wherein JC$_1$<JC$_2$, wherein the memory storage element further comprising a plurality of alternating magnetic domains of opposite directions that are separated from each other by domain walls located therebetween, and wherein data is stored in the memory storage element as specific locations of magnetic domains and domain walls;

applying a driving current to the memory storage element to effectuate movements of the magnetic domains and domain walls past a reading or writing device, wherein the driving current has a constant current density (JC$_{constant}$) that is greater than JC$_2$, wherein the domain walls have a first velocity (V$_A$) in the first ferromagnetic layers at the driving current and a second velocity (V$_B$) in the second ferromagnetic layers at the driving current, wherein V$_B$<V$_A$; and selectively reading data from, or writing data into, said memory storage element when the domain wall velocity is equal to V$_B$.

Other aspects, features and advantages of the invention will be more fully apparent from the ensuing disclosure and appended claims.

DETAILED DESCRIPTION OF THE INVENTION, AND PREFERRED EMBODIMENTS THEREOF

Figure 1A:
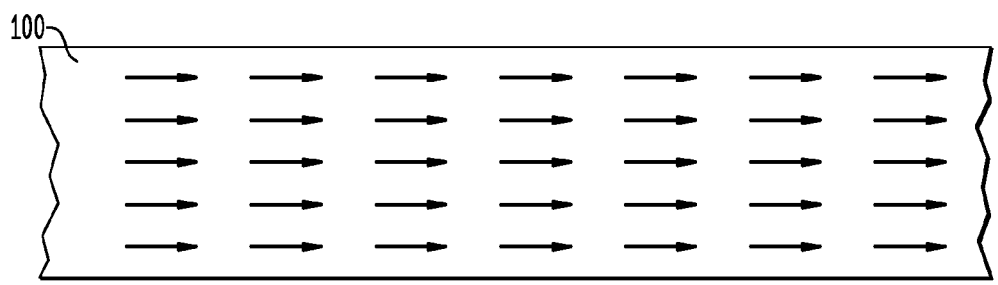
FIG. 1A shows a partial view of a prior art ferromagnetic wire that is homogeneously magnetized with only one magnetic domain therein.
Figure 1B:
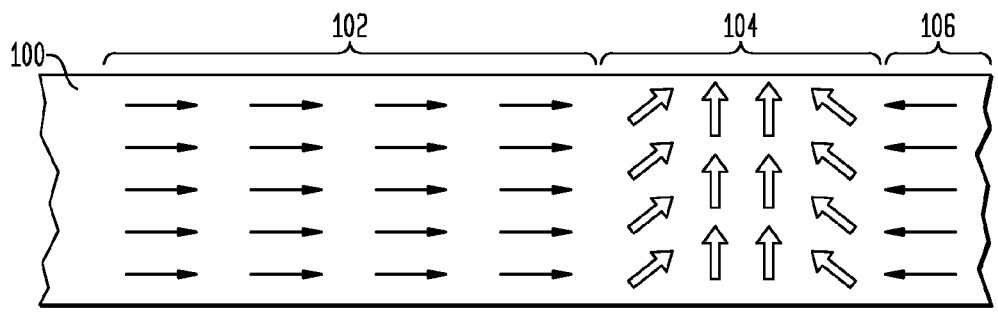
FIG. 1B shows a partial view of the prior art ferromagnetic wire of FIG. 1A after sectional magnetization, which contains at least two magnetic domains of opposite directions with a domain wall therebetween.
Figure 1C:
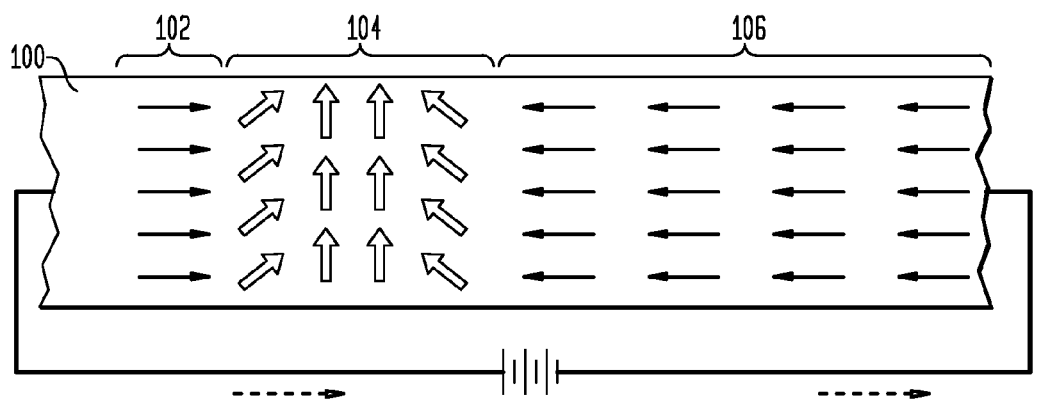
FIG. 1C shows movement of the magnetic domains in the prior art ferromagnetic wire of FIG. 1B upon application of a driving current.
Figure 2:
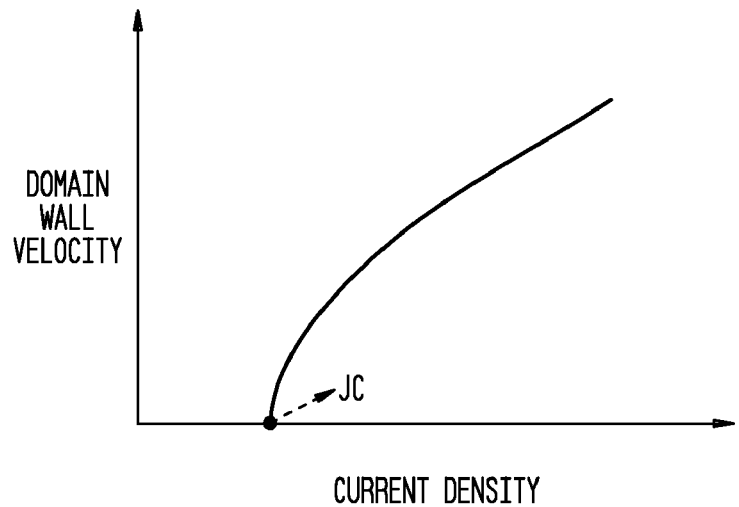
FIG. 2 is a graph that plots the domain wall velocity in a prior art ferromagnetic material as a function of the density of the applied driving current.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The term "critical current density" or "JC" as used herein refers to the threshold current density that is required for driving the domain walls located between alternating magnetic domains of opposite directions across a specific ferromagnetic material.

U.S. Pat. No. 6,834,005, which was issued on Dec. 21, 2004 for "SHIFTABLE MAGNETIC SHIFT REGISTER AND METHOD OF USING THE SAME," is incorporated herein by reference in its entirety for all purposes.

The present invention employs two or more materials with different intrinsic properties to achieve precise control over the domain wall movements. Specifically, any change in the material properties of a ferromagnetic layer, such as material composition, stress, local roughness, grain size, spin polarization, saturation magnetization, spin transfer efficiency, local spin, lattice constant, coercivity, magnetic anisotropy, exchange coupling energy, domain wall thickness, magnetostriction, etc., will have impacts on the critical current density as well as on the velocity of the domain wall movements in such a ferromagnetic layer.

The term "ferromagnetic layer" or "ferromagnetic layers" as used herein refers to one or more layer structures that exhibit spontaneous magnetization overall. The ferromagnetic layer or layers of the present invention comprise(s) at least one ferromagnetic element, with or without additional ferromagnetic or non-ferromagnetic elements.

The critical current density (JC), which is required for initiating the domain wall movements in a ferromagnetic material, is determined as follows:

$$JC = \frac{e \cdot S^2}{a^3 \cdot \hbar} \cdot K \cdot \lambda, \quad (I)$$

while S is the localized spin of the ferromagnetic material, a is the lattice constant of the ferromagnetic material, K is the hard axis magnetic anisotropy of the ferromagnetic material, λ is the domain wall thickness in the ferromagnetic material, which in turn depends on the ratio between magnetic exchange coupling and anisotropy of the ferromagnetic material, e is the charge carried by a single electron (which is a constant), and $\hbar$ is an universal constant. See *Gen Tatara and HiroShi Kohno, Physical Review Letters,* 92 (8) 086601 (2004).

It is therefore clear that the critical current density (JC) required for initiating the domain wall movements in a ferromagnetic material is directly determined by the material properties of the ferromagnetic material.

Further, the velocity of domain wall movement (V) depends on the material properties of the ferromagnetic material in which the domain walls are located and through which the domain walls are moved at the applied driving current, according to the following equation:

$$V \propto \frac{g \cdot \mu_B \cdot P}{2 \cdot e \cdot M_S} \cdot J, \quad (II)$$

wherein P is the current polarization, i.e., the percentage of the electrons in the applied driving current that is polarized by the local magnetization, $\mu_B$ is the Bohr magneton (which is a constant), e is the charge carried by a single electron (which is a constant), $M_s$ is the saturation magnetization of the ferromagnetic material, g is the spin transfer efficiency of the ferromagnetic material, and J is the current density of the applied driving current. See *A. Thiaville, Y. Nakatani, J. Miltat, and Y. Suzuki, Euophysics Letters,* 69(6), 990 (2005).

Therefore, both the critical current density (JC) and the domain wall movement velocity (V) (when the density of the driving current is higher than the critical current density) will be different for different ferromagnetic materials. In other words, the resistance to the domain wall movement varies in different ferromagnetic materials.

Figure 3:
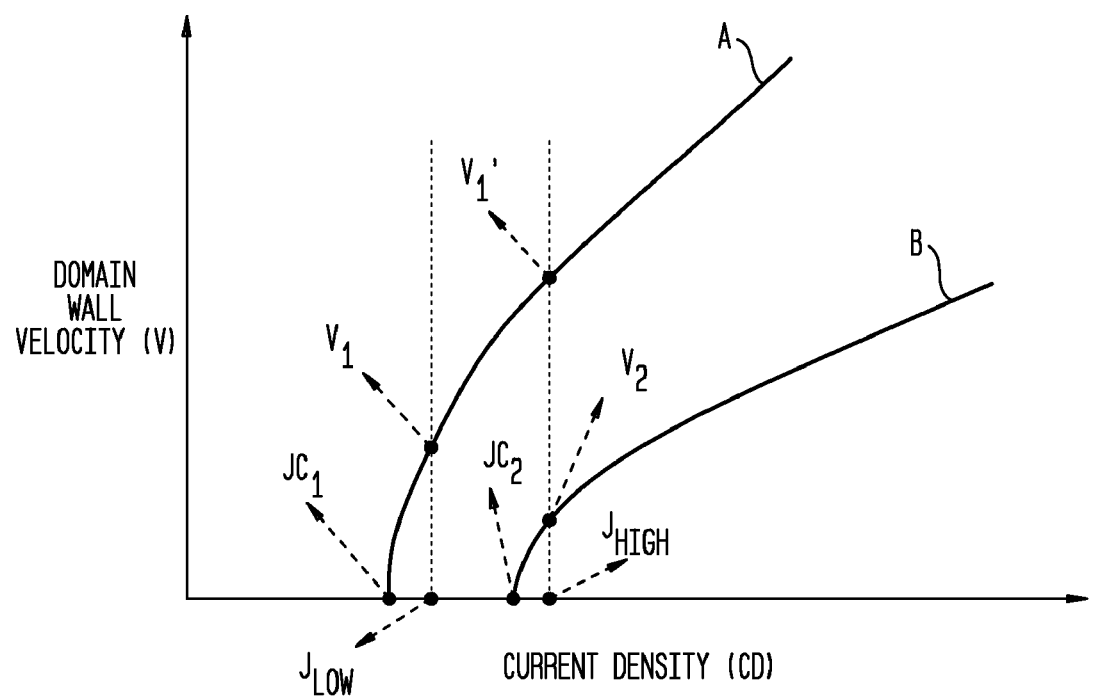
FIG. 3 is a graph that plots the domain wall velocities in two different ferromagnetic materials as a function of the density of an applied driving current.

For example, when the critical current densities for two different ferromagnetic materials A and B are $JC_1$ and $JC_2$, with $JC_1<JC_2$, as shown in FIG. 3, application of a driving current having a relatively low current density ($J_{low}$) that is greater than $JC_1$ but less than $JC_2$ will cause movement of domain walls in the first ferromagnetic material A, but not in the second ferromagnetic material B. Alternatively, application of a driving current having a relatively high current density ($J_{high}$) that is lager than $JC_2$ will cause movement of domain walls in both the first and second ferromagnetic materials A and B, but at different velocities. Typically, the domain walls will move significantly slower in the second ferromagnetic material B, which has a higher critical current density in comparison with the first ferromagnetic material A, as shown in FIG. 3.

Based on the above observations, the present invention provides a ferromagnetic structure that comprises alternating ferromagnetic layers of different material properties as listed hereinabove. Such a ferromagnetic structure can be used for pinning the domain walls and ensuring movement of the domain walls at very discrete and precise increments or steps, without any drifting.

Figure 4A:
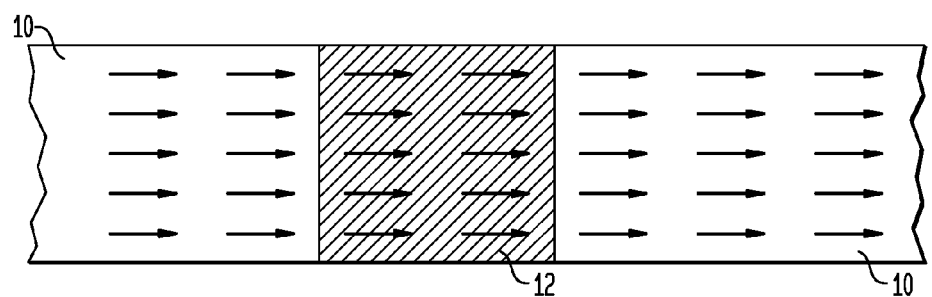
FIG. 4A shows a partial view of a ferromagnetic wire containing alternating layers of two different ferromagnetic materials, according to one embodiment of the present invention, while such a ferromagnetic wire is homogeneously magnetized with only one magnetic domain therein.

Specifically, FIG. 4A shows a partial view of a ferromagnetic wire that contains alternating layers 10 and 12 of different first and second ferromagnetic materials A and B. The layers 10, which contain the first ferromagnetic material A, have a first critical current density ($JC_1$), and the layers 12, which contain the second ferromagnetic material B, have a second, larger current density ($JC_2$). The entire ferromagnetic wire as shown in FIG. 4A is homogeneously magnetized with only one magnetic domain therein, which is indicated by the arrowheads that represent the magnetic moments of the atoms or ions contained by the ferromagnetic wire of FIG. 4A.

Figure 4B:
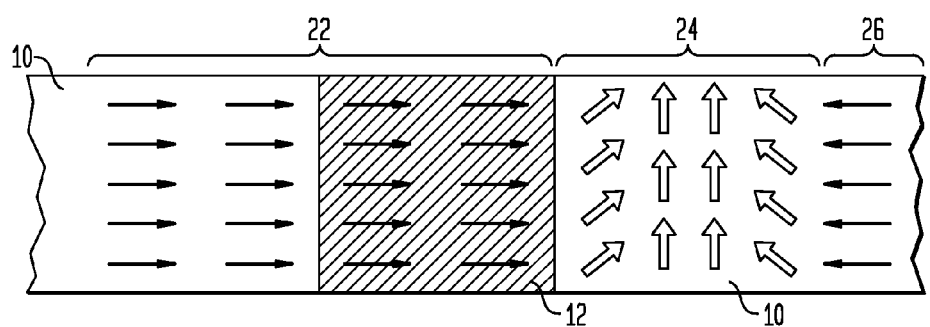
FIG. 4B shows a partial view of the ferromagnetic wire of FIG. 4A after sectional magnetization, which contains at least two magnetic domains of opposite directions with a domain wall therebetween.

The ferromagnetic wire of FIG. 4A can be magnetized in small sections to form alternating magnetic domains 22 and 26 of opposite directions, as shown in FIG. 4B. Such opposite magnetic domains 22 and 26 are separated from each other by a domain wall 24 located therebetween, within which the magnetization gradually changes from one direction to another. One of the magnetic domains 22 extends from one of the layers 10 containing the first ferromagnetic material A into an adjacent layer 12 containing the second ferromagnetic material B. A subsequent domain wall 24 and a subsequent magnetic domain 26 (of an opposite direction) are both located in a subsequent layer 10 that also contains the first ferromagnetic material A, as shown in FIG. 4B.

Figure 4C:
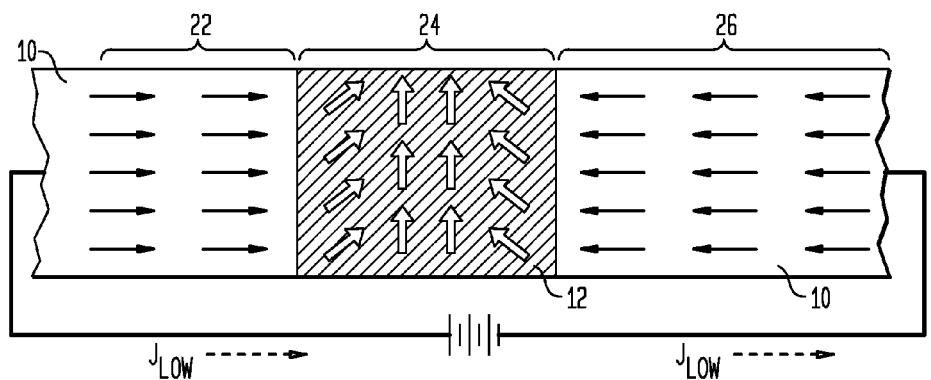
FIG. 4C shows movement of the magnetic domains in the ferromagnetic wire of FIG. 4B upon application of a relatively low driving current.

When a driving current of a relatively low current density ($J_{low}$, while $JC_1<J_{low}<JC_2$) is applied to the ferromagnetic wire, as shown in FIG. 4C, the domain wall 24 will be moved across the subsequent layer 10, which contains the first ferromagnetic material A of the relatively low critical current density ($JC_1$). Specifically, the domain wall 24 moves along the direction of the driving current, i.e., from right to left, and at a domain wall velocity that is determined by $J_{low}$ and the material properties of the first ferromagnetic material A. However, once the domain wall 24 enters the layer 12, which contains the second ferromagnetic material B of the relatively high critical current density ($JC_2$), the movement stops, and the domain wall 24 is "pinned" at the layer 12, because the driving current of the relatively low current density ($J_{low}$) is insufficient to overcome the resistance of the second ferromagnetic material B and to move the domain wall 24 out of the layer 12, as shown in FIG. 4C. Therefore, no matter how long the driving current of $J_{low}$ is applied to the ferromagnetic wire, the domain wall 24 will remain within the layer 12 of the second ferromagnetic material B.

Figure 4D:
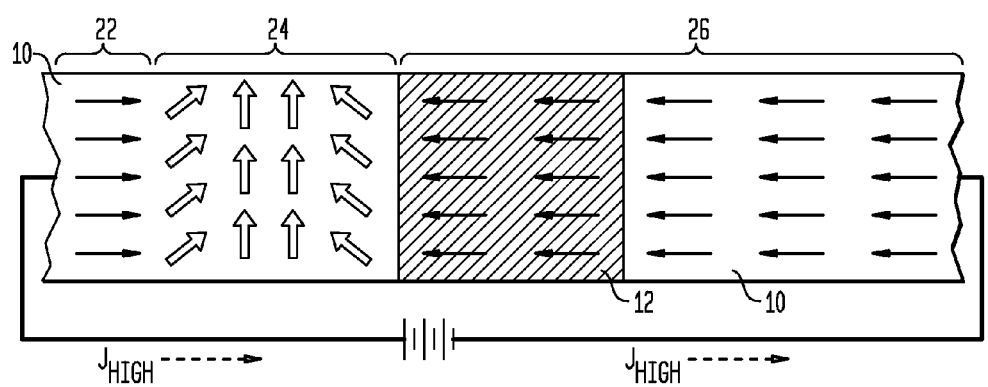
FIG. 4D shows movement of the magnetic domains in the ferromagnetic wire of FIG. 4B upon application of a relatively high driving current.

However, another driving current of a relatively high current density ($J_{high}$, while $JC_2<J_{high}$) can be used to overcome the resistance of the second ferromagnetic material B and to move the domain wall 24 out of the layer 12 into the preceding layer 10, as shown in FIG. 4D. The driving current of $J_{high}$ can be a very short pulse, as long as the pulse duration is sufficient for moving the domain wall 24 out of the layer 12. Once again in the preceding layer 10, which comprises the first ferromagnetic material A, the previously used driving current of $J_{low}$ is sufficient for moving the domain wall 24 along until it enters another layer 12 of the second ferromagnetic material B.

In this manner, a posed driving current can be used for moving the domain walls across the ferromagnetic wire of FIGS. 4A-4D at discrete increments or steps.

In order to more effectively pin the domain walls and more precisely control the domain wall movements, it is important to limit the thickness of the ferromagnetic material layers that contain the second ferromagnetic material B of the relatively high critical current density (i.e., the layers 12). The layer thickness should be as close to the domain wall thickness (λ)

in the second ferromagnetic material B as possible. Preferably, the layers 12 have a layer thickness ranging from about 20 nm to about 200 nm, more preferably from about 40 nm to about 200 nm, and most preferably of about 50 nm.

The ferromagnetic material layers that contain the first ferromagnetic material A of the relatively low critical current density (i.e., layers 10) may have any thickness suitable for accommodating the magnetic domains. Preferably, the layers 10 has a layer thickness that is significantly greater than that of the layers 12, so that the discrete, incremental movement of the domain walls in the layers 10 are more distinguishable from the non-movement in the layers 12. For example, the layers 10 preferably has a layer thickness of greater than about 300 nm, more preferably above 400 nm, and most preferably above 500 nm.

Figure 5:
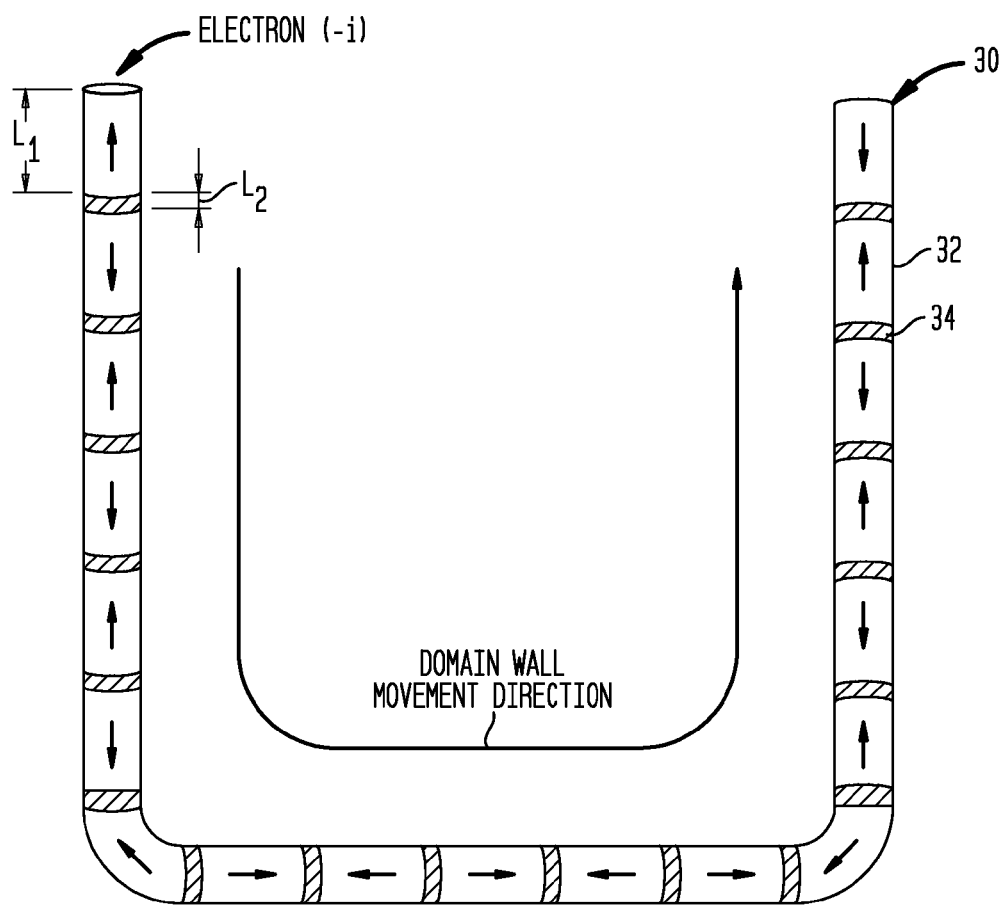
FIG. 5 shows an exemplary memory storage device that comprises alternating layers of different ferromagnetic materials, according to one embodiment of the present invention.

FIG. 5 shows a memory storage element 30 that comprises a "U"-shaped ferromagnetic wire or strip containing alternating ferromagnetic layers 32 and 34 that comprise, respectively, the first and second ferromagnetic materials A and B. On one hand, the layers 32, which comprise the first ferromagnetic material A of the relatively low critical current density, have a layer thickness $L_1$ that is greater than about 300 nm. On the other hand, the layers 34, which comprise the second ferromagnetic material B of the relatively high critical current density, have a layer thickness $L_2$ that ranges from about 20 nm to about 200 nm. Sectional magnetization has been carried out so as to form alternating magnetic domains of opposite directions (as indicated by the arrowhead in the ferromagnetic wire in FIG. 5) that are separate from each other by domain walls.

A driving current can be applied to the ferromagnetic wire of FIG. 5 to effectuate movements of the domain walls therein, so that the corresponding magnetic domains in such a ferromagnetic wire can be moved past a reading or writing device, which then reads data from or writes data into, the ferromagnetic wire, as described by U.S. Pat. No. 6,834,005, which has been incorporated by reference hereinabove.

It is important to note that although the ferromagnetic wire as illustratively shown in FIG. 5 has a substantially circular cross-sectional shape, the present invention is not so limited and also broadly includes any ferromagnetic structures with any regular or irregular cross-sectional shape, such as square, rectangular, triangular, polygonal, semi-circular, ellipsoidal, etc. Further, the ferromagnetic structure of the present invention may be either a solid wire, or any tubular structure that encloses an insulating or highly resistive semiconductor core that is non-magnetic therein.

Figure 6:
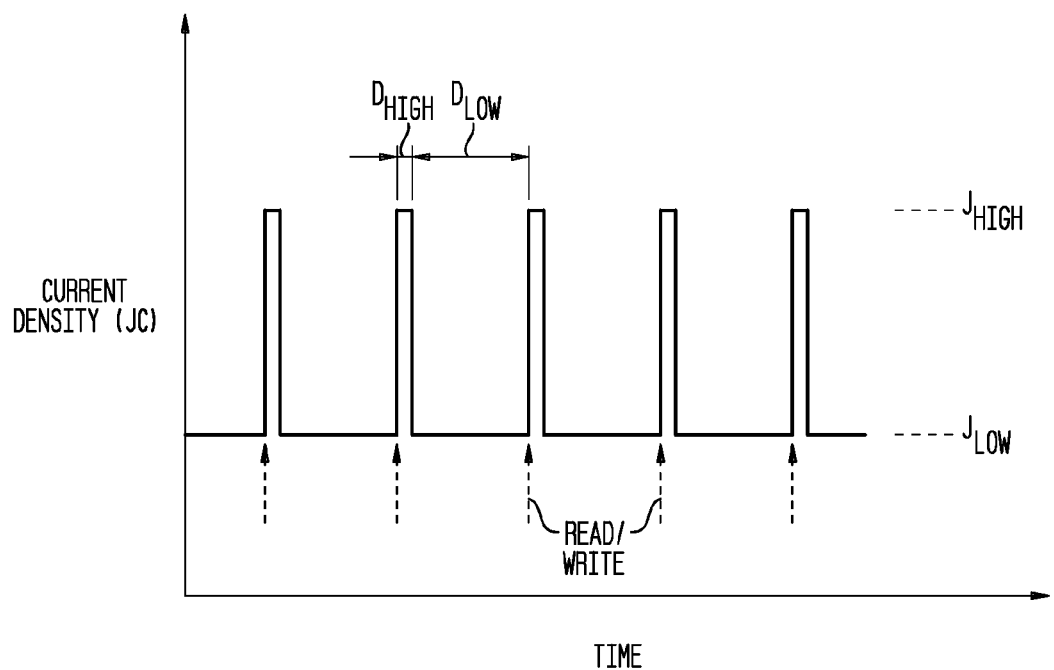
FIG. 6 shows an exemplary pulsed current that can be used to precisely control domain wall movements in the memory storage device of FIG. 5, according to one embodiment of the present invention.

In a particularly preferred embodiment of the present invention, a pulsed current as shown by FIG. 6 is used for moving the domain walls and magnetic domains along the ferromagnetic wire shown in FIG. 5. Specifically, the pulsed current contains alternating high and low current pulses. Each low current pulse has a relatively low current density ($J_{low}$) that is greater than $JC_1$ but less than $JC_2$, and each high current pulse has a relatively high current density ($J_{high}$) that is greater than $JC_2$. The low current pulses function to move the domain walls across the first ferromagnetic layers 32 and stop at the second ferromagnetic layers 34, while the high current pulses function to move the domain walls out of the second ferromagnetic layers 34 into the first ferromagnetic layers 32.

Preferably, the high and low current pulses are timed so as to minimize either drifting (i.e., undesired movement beyond the designated point) or staggering (i.e., premature stop before reaching the designated point) of the domain walls.

As shown in FIG. 3, the domain walls have a first velocity ($V_1$) in the first ferromagnetic material layers 32 under the low current pulses, a second velocity ($V_1$') in the first ferromagnetic layers under the high current pulses, and a third velocity ($V_2$) in the second ferromagnetic material layers 34 under the high current pulses. It is preferred that the duration of the low current pulses ($D_{low}$) is equal to or greater than $L_1/V_1$ but less than $2\times L_1/V_1$, and that the duration of the high current pulses ($D_{high}$) is equal to or greater than $L_2/V_2$ but less than $L_2/V_2+L_1/V_1'$.

If $D_{low}<L_1/V_1$, the low current pulses would not be long enough to move the domain walls through the entire length of the first ferromagnetic material layers 32. Consequently, the domain walls would stop prematurely within the first ferromagnetic material layers 32 before reaching the second ferromagnetic material layers 34, thereby resulting in staggering.

Extended application of the low current pulses has little or no impact on the domain wall movements, because once the domain walls move out of the first ferromagnetic material layers 32 into the second ferromagnetic material layers 34, further application of the low current pulses will not result in any further movement of the domain walls in the second ferromagnetic material layers 34. Therefore, $D_{low}$ can be greater than $L_1/V_1$. However, in order to avoid significant heating of the wire upon the application of current and also to achieve speedy operation of the device, it is preferable to limit $D_{low}$ to not more than $2\times L_1/V_1$, and more preferably not more than $1.5\times L_1/V_1$.

Similarly, if $D_{high}<L_2/V_2$, the high current pulses would not be long enough to move the domain walls out of the second ferromagnetic material layers 34. Correspondingly, the domain walls would stop prematurely within the second ferromagnetic material layers 32 before reaching the first ferromagnetic material layers 34, thereby also resulting in staggering. It is thus preferred to use a high current pulse that has a duration ($D_{high}$) that is equal to or greater than $L_2/V_2$.

However, if $D_{high}>>L_2/V_2$, even after the domain walls moved out of the second ferromagnetic material layers 32, they would continue to move along the ferromagnetic wire across the subsequent first and second ferromagnetic material layers and would not stop until after $D_{high}$ has completely expired. Therefore, extended application of the high current pulse would result in deleterious drifting of the domain walls and is detrimental for the function of the memory storage device. It is thus preferred to use a relatively short high current pulse that has a duration ($D_{high}$) that is less than $L_2/V_2+L_1/V_1'$, more preferably less than $L_2/V_2+\frac{1}{2}L_1/V_1/V_1'$, and most preferably less than $L_2/V_2+\frac{1}{4}L_1/V_1'$, which is sufficient for moving the domain walls out of the first ferromagnetic material layers without causing significant drifting.

At the end of each low current pulse and before initiation of the next high current pulse, the positions of the magnetic domains and domain walls remain substantially the same. Reading and writing can then be carried out from and to the memory storage device of FIG. 5 at such time, by using the reading and writing devices disclosed by U.S. Pat. No. 6,834,005.

The total number of low and high current pulses in the driving current can be changed according to the specific requirement of domain wall movements. For example, for moving six (6) magnetic domains and five (5) domain walls through a reading or writing device at a specific location, a driving current containing six (6) low current pulses and five (5) high current pulses, as that shown in FIG. 6, should be used. For another example, for moving four (4) magnetic domains and three (3) domain walls through a reading or writing device at a specific location, a driving current containing four (4) low current pulses and three (3) high current pulses should be used.

Although more than two different ferromagnetic layers can be employed to form the ferromagnetic structure of the present invention, and although additional extremely thin (e.g., less than 10 nm) non-ferromagnetic layers may also be included in the ferromagnetic structure of the present invention, the following descriptions are primarily directed to a structure comprising only two different ferromagnetic layers for simplicity reasons, and such simplified description should not be construed to limit the broad scope of the present invention.

The ferromagnetic materials A and B as disclosed hereinabove may comprise any suitable ferromagnetic elements, either in pure form or as an alloy or mixture with other ferromagnetic or non-ferromagnetic elements, as long as they would have different resistance to the domain wall movement, due to their different material properties. For example, the ferromagnetic materials A and B may comprise any ferromagnetic material(s) that comprise(s) one or more ferromagnetic elements, including, but not limited to: Fe, Ni, Co, Gd, Dy, Tb, Ho, Er, and mixtures or combinations thereof In addition to the ferromagnetic element(s), the ferromagnetic materials A and B may further comprise any non-ferromagnetic element(s), including, but not limited to: Ru, Mo, Mn, Cr, Si, Ge, Ga, As, Cu, Re, Rh, Pt, Au, B, P, etc., provided that such non-ferromagnetic element(s) does not affect the overall ferromagnetic characteristic of materials A and B.

The ferromagnetic materials A and B may comprise different ferromagnetic elements, or the same ferromagnetic elements but alloyed or mixed with different non-ferromagnetic elements, or the same ferromagnetic elements but in different proportions, or the same ferromagnetic compositions but with different grain sizes or grain structures, etc. As mentioned hereinabove, the difference between the ferromagnetic materials A and B may reside in one or more material properties selected from the group consisting of material composition, stress, local roughness, grain size, spin polarization, saturation magnetization, spin transfer efficiency, local spin, lattice constant, coercivity, magnetic anisotropy, exchange coupling energy, domain wall thickness, magnetostriction, etc.

Alternating layers containing materials A and B can be readily formed by one or more well-known deposition processes, such as chemical vapor deposition (CVD) processes, physical vapor deposition (PVD) processes, atomic layer deposition (ALD) processes, electrochemical deposition (ECD) processes, and electroless deposition processes.

In an exemplary, but not necessary, embodiment of the present invention, the first and second ferromagnetic material layers A and B both contain the same ferromagnetic elements which are alloyed in different proportions. Such layers A and B can be deposited by a pulsed ECD process, as described by the co-pending U.S. patent application entitled "FORMATION OF NANOSTRUCTURES COMPRISING COMPOSITIONALLY MODULATED FERROMAGNETIC LAYERS BY PULSED ECD," which is assigned to the same assignee as the present application and which has been incorporated by reference hereinabove, For example, a pulsed plating potential can be applied to a plating solution that comprises $Ni^{2+}$, $Fe^{2+}$ and one or more species, such as NaCl, for formatting of alternating layers of different Ni—Fe alloys. The pulsed plating potential contains high potential pulses and low potential pulses. During the high potential pulses, relatively less Fe will be deposited and relatively more Ni will be deposited. In contrast, during the low potential pulses, relatively more Fe will be deposited and relatively less Ni will be deposited. In this manner, alternating layers of Ni-rich alloy of NiFe and Fe-rich alloy of NiFe can be deposited to form a ferromagnetic wire, which contains alternating layers of different NiFe alloys. The Ni content in the Ni-rich alloy of NiFe so deposited may range from about 75 wt % to about 85 wt %, and the Fe content in the Ni-rich alloy of NiFe so deposited may range from about 15 wt % to about 25 wt %. The Ni content in the Fe-rich alloy of NiFe so deposited may range from about 30 wt % to about 60 wt %, and the Fe content in the Fe-rich alloy of NiFe so deposited may range from about 40 wt % to about 70 wt %.

Figure 7A:
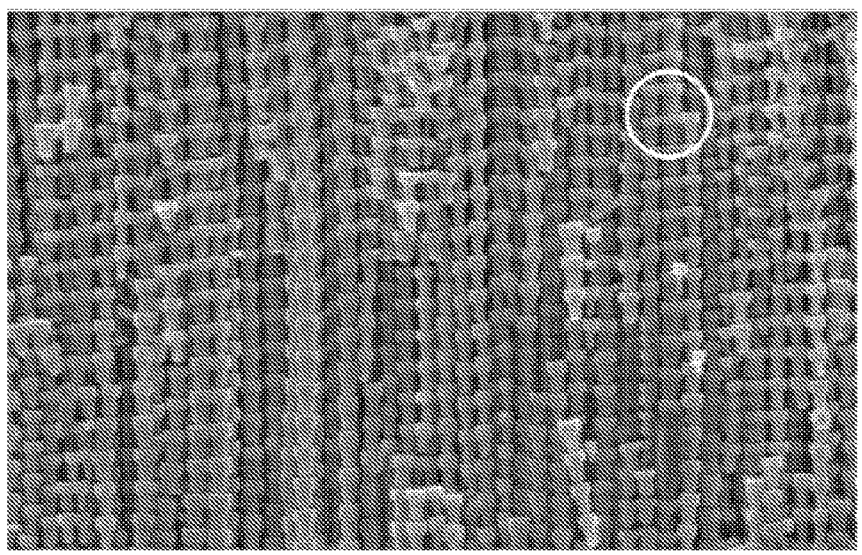
FIGS. 7A-7B shows ferromagnetic wires that contains alternating layers of Ni$_{45}$Fe$_{55}$ and Ni$_{80}$Fe$_{20}$, while the Ni$_{45}$Fe$_{55}$ layers have been selectively etched for imaging purposes, according to one embodiment of the present invention.
Figure 7B:
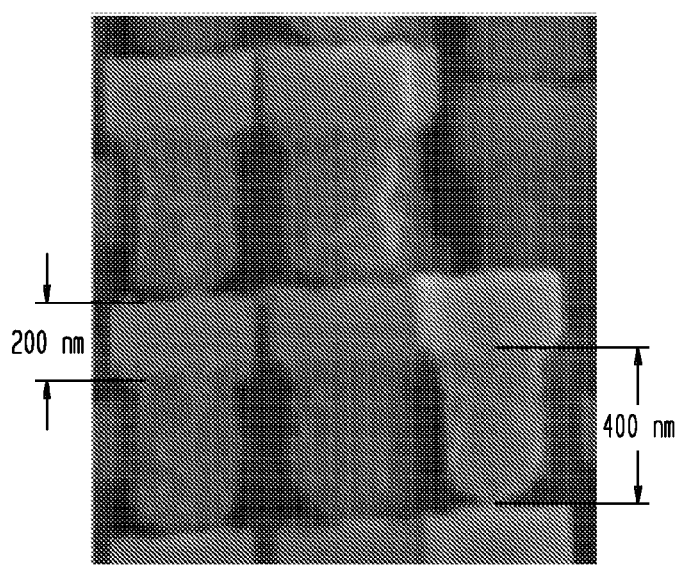

FIG. 7A shows a SEM picture of multiple ferromagnetic wires containing alternating layers of $Ni_{45}Fe_{55}$ and $Ni_{80}Fe_{20}$. For better demonstration of the capability to form compositionally modulated ferromagnetic layers, the $Ni_{45}Fe_{55}$ layers were etched. Typically, Ni—Fe alloys with higher Fe contents etch faster than Ni—Fe alloys with lower Fe contents. FIG. 7B is an enlarged picture of the region circled by white in FIG. 7A. The $Ni_{45}Fe_{55}$ layers as shown in FIG. 7B have a layer thickness of about 400 nm, and the $Ni_{80}Fe_{20}$ layers have a layer thickness of about 200 nm. The $Ni_{45}Fe_{55}$ and $Ni_{80}Fe_{20}$ alloys have significantly different coercivity, magnetization, magnetostriction and/or other magnetic properties and are particularly preferred for forming the ferromagnetic structures of the present invention.

The present invention further contemplates a memory storage element that is similar to that described hereinabove, but which comprises alternating ferromagnetic layers of any suitable thicknesses. A substantially constant driving current can be applied to such a memory storage element to effectuate movements of the magnetic domains and domain walls through a reading or writing device.

Figure 8:
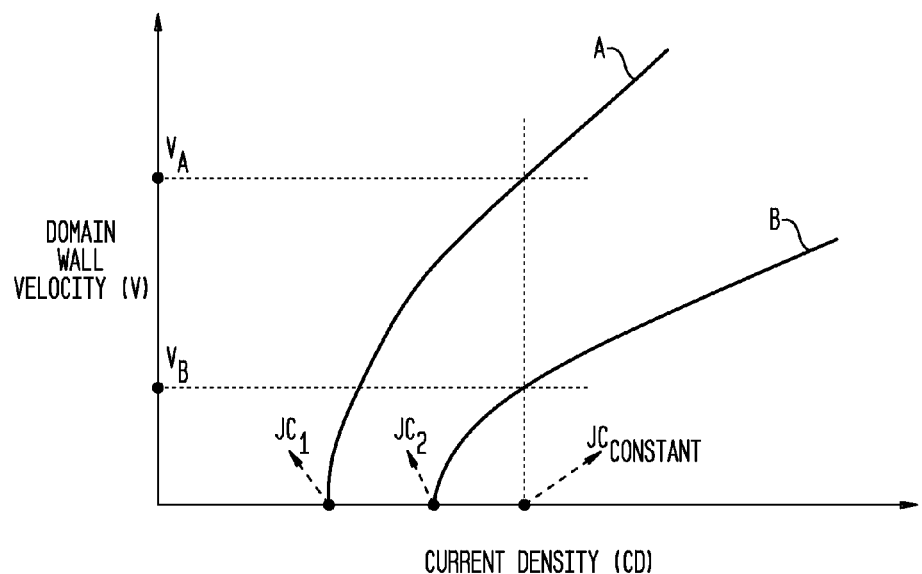
FIG. 8 is a graph that shows different domain wall velocities in different ferromagnetic materials under a constant driving current.
Figure 9:
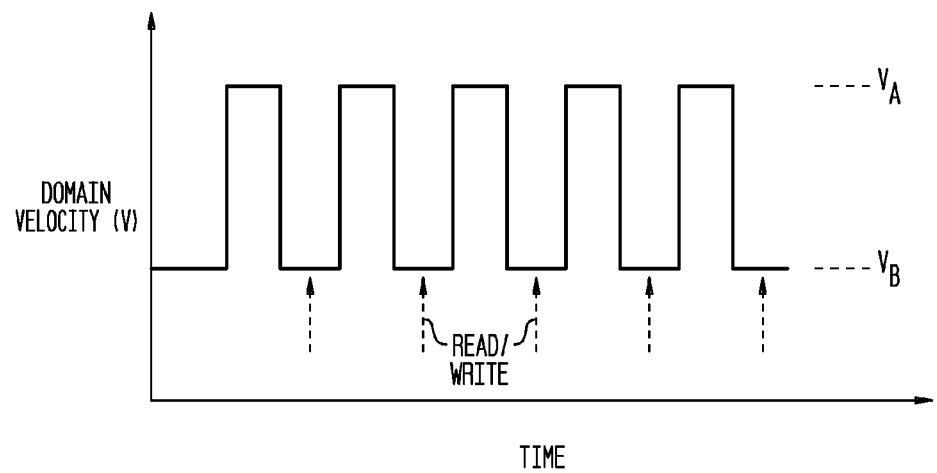
FIG. 9 is a graph that shows the change of domain wall velocity over time under a constant driving current in a memory storage device that comprises alternating layers of different ferromagnetic materials.

Specifically, the driving current has a constant current density ($J_{constant}$) that is greater than the critical current densities of both first and second ferromagnetic materials A and B (i.e., $JC_1 < JC_2 < JC_{constant}$). Under such a driving current, the domain walls are moved across the alternating first and second ferromagnetic layers of materials A and B, but at different velocities, i.e., the domain walls move at a first velocity ($V_A$) in the first ferromagnetic material A and a second velocity ($V_B$) in the second ferromagnetic material B, as shown in FIG. 8, $V_A << V_B$. Correspondingly, the domain wall velocity in the overall memory storage element oscillates over time between $V_A$ and $V_B$ under this constant driving current, as shown in FIG. 9, and data reading and writing can be readily carried out when the domain walls are moving at a relatively slow velocity ($V_B$).

In such a memory storage element, the second ferromagnetic layers are no longer used for pinning the domain walls. Instead, the second ferromagnetic layers are now used to slow down the domain wall movement and to establish read/write intervals. Consequently, the second ferromagnetic layers in such a memory storage element needs to be thick enough to provide an interval long enough for the information to be read and written. For example, the second ferromagnetic layers can have a layer thickness that is comparable to that of the first ferromagnetic layers.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A structure comprising at least a plurality of alternating first and second ferromagnetic layers, wherein each of the first ferromagnetic layers has a first layer thickness ($L_1$) and a first critical current density ($JC_1$), and wherein each of the second ferromagnetic layers has a second layer thickness ($L_2$)

and a second critical current density ($JC_2$), wherein $JC_1 < JC_2$, wherein $L_1$ is greater than about 300 nm, and wherein $L_2$ ranges from about 20 nm to about 200 nm.

2. The structure of claim 1, further comprising a plurality of alternating magnetic domains of opposite magnetization that are separated from each other by domain walls located therebetween, and wherein said magnetic domains and domain walls can be moved across the first and second ferromagnetic layers upon application of a driving current to said structure.

3. The structure of claim 1, further comprising one or more additional layers between the first and second ferromagnetic layers.

4. The structure of claim 1, wherein the first and second ferromagnetic layers differ in one or more properties selected from the group consisting of material composition, stress, local roughness, grain size, spin polarization, saturation magnetization, spin transfer efficiency, local spin, lattice constant, coercivity, magnetic anisotropy, exchange coupling energy, domain wall thickness, and magnetostriction.

5. The structure of claim 4, wherein the first and second ferromagnetic layers differ in material composition.

6. The structure of claim 5, wherein the first and second ferromagnetic layers comprise different ferromagnetic elements.

7. The structure of claim 5, wherein the first and second ferromagnetic layers comprise the same ferromagnetic elements alloyed with different non-ferromagnetic elements.

8. The structure of claim 5, wherein the first and second ferromagnetic layers comprise the same ferromagnetic elements but in different proportions.

9. The structure of claim 8, wherein the first and second ferromagnetic layers both comprise Ni—Fe alloys, wherein the first ferromagnetic layers comprise a first Ni—Fe alloy having from about 75 wt % to about 85 wt % of Ni and from about 15 wt % to about 25 wt % of Fe, and wherein the second ferromagnetic layers comprise a second Ni—Fe alloy having from about 30 wt % to about 60 wt % of Ni and from about 40 wt % to about 70 wt % of Fe.

10. The structure of claim 1, wherein $L_1$ is greater than about 400 nm, and wherein $L_2$ ranges from about 40 nm to about 200 nm.

11. The structure of claim 1, wherein the first and second ferromagnetic layers form a metal wire or metal strip having a diameter ranging from about 20 mn to about 200 nm.

12. A memory device comprising:
   a memory storage element comprising the structure of claim 2, wherein data is stored in said memory storage element as locations of magnetic domains and domain walls;
   a reading element positioned in proximity to the memory storage element for selectively reading data from said memory storage element; and
   a writing element positioned in proximity to the memory storage element for selectively writing data into said memory storage element.

13. The memory device of claim 12, further comprising a current source for applying a driving current to the memory storage element to effectuate movements of specific magnetic domains past at one of the reading and writing elements, so that data can be read from or written into the memory storage element.

14. The memory device of claim 13, wherein the driving current is a pulsed current with alternating high and low current pulses, wherein the low current pulses have a relatively low current density ($J_{low}$) that is greater than $JC_1$ but is less than $JC_2$ for moving the magnetic domains and domain walls across the first ferromagnetic layers and stopping at the second ferromagnetic layers, and wherein the high current pulses ($J_{high}$) have a relatively high current density that is greater than $JC_2$ for moving the magnetic domains and domain walls out of the second ferromagnetic layers.

15. The memory device of claim 14, wherein the domain walls have a first velocity ($V_1$) in the first ferromagnetic layers under the low current pulses, a second velocity ($V_1'$) in the first ferromagnetic layers under the high current pulses, and a third velocity ($V_2$) in the second ferromagnetic layers under the high current pulses, wherein the duration of the low current pulses ($D_{low}$) is equal to or greater than $L_1/V_1$ but less than $2 \times L_1/V_1$, and wherein the duration of the high current pulses ($D_{high}$) is equal to or greater than $L_2/V_2$ but less than $L_2/V_2 + L_1/V_1'$.

16. The memory device of claim 15, wherein the reading or writing element reads from or writes to the memory storage element at the end of a low current pulse but before next high current pulse.

17. A method comprising:
   forming a memory storage element comprising the structure of claim 2, wherein data is stored in said memory storage element as locations of magnetic domains and domain walls;
   selectively reading data from said memory storage element; and
   selectively writing data into said memory storage element.

18. The method of claim 17, wherein the selective reading or writing is carried out by applying a driving current to the memory storage element to effectuate movements of the magnetic domains past a reading or writing device.

19. The method of claim 18, wherein the driving current is a pulsed current with alternating high and low current pulses, wherein the low current pulses have a relatively low current density ($J_{low}$) that is greater than $JC_1$ but is less than $JC_2$ for moving the magnetic domains and domain walls across the first ferromagnetic layers and stopping at the second ferromagnetic layers, and wherein the high current pulses ($J_{high}$) have a relatively high current density that is greater than $JC_2$ for moving the magnetic domains and domain walls out of the second ferromagnetic layers.

20. The method of claim 19, wherein the domain walls have a first velocity ($V_1$) in the first ferromagnetic material layers under the low current pulses, a second velocity ($V_1'$) in the first ferromagnetic material layers under the high current pulses, and a third velocity ($V_2$) in the second ferromagnetic material layers under the high current pulses, wherein the duration of the low current pulses ($D_{low}$) is equal to or greater than $L_1/V_1$ but less than $2 \times L_1/V_1$, and wherein the duration of the high current pulses ($D_{high}$) is equal to or slightly greater than $L_2/V_2$ but less than $L_2/V_2 + L_1/V_1'$.

21. The method of claim 20, wherein the selective reading or writing is carried out at the end of a low current pulse but before next high current pulse.

22. A method comprising:
   forming a memory storage element comprising at least a plurality of alternating first and second ferromagnetic layers, wherein each of the first ferromagnetic layers has a first critical current density ($JC_1$), wherein each of the second ferromagnetic layers has a second critical current density ($JC_2$), wherein $JC_1 < JC_2$, wherein said memory storage element further comprising a plurality of alternating magnetic domains of opposite directions that are separated from each other by domain walls located therebetween, and wherein data is stored in said memory storage element as locations of magnetic domains and domain walls;

applying a driving current to the memory storage element to effectuate movements of the magnetic domains and domain walls past a reading or writing device, wherein the driving current has a constant current density ($JC_{constant}$) that is greater than $JC_2$, wherein the domain walls have a first velocity ($V_A$) in the first ferromagnetic layers under the driving current and a second velocity ($V_B$) in the second ferromagnetic layers under the driving current, wherein $V_B < V_A$; and selectively reading data from, or writing data into, said memory storage element when the domain wall velocity is equal to $V_B$.

* * * * *